US00RE41684E

(19) United States
(12) Reissued Patent
Fischer et al.

(10) Patent Number: US RE41,684 E
(45) Date of Reissued Patent: Sep. 14, 2010

(54) SET OF INTEGRATED CAPACITOR ARRANGEMENTS, ESPECIALLY INTEGRATED GRID CAPACITORS

(75) Inventors: Armin Fischer, Munich (DE); Franz Ungar, Munich (DE)

(73) Assignee: Infineon Technologies AG, Munich (DE)

(21) Appl. No.: 12/175,170
(22) PCT Filed: Jun. 12, 2003
(86) PCT No.: PCT/DE03/01956
§ 371 (c)(1),
(2), (4) Date: Aug. 8, 2005
(87) PCT Pub. No.: WO2004/006334
PCT Pub. Date: Jan. 15, 2004

Related U.S. Patent Documents

Reissue of:
(64) Patent No.: 7,079,375
Issued: Jul. 18, 2006
Appl. No.: 10/520,742
Filed: Aug. 8, 2005

(30) Foreign Application Priority Data

Jul. 8, 2002 (DE) ..... 10230697

(51) Int. Cl.
*H01G 4/38* (2006.01)

(52) U.S. Cl. ..... 361/328; 361/329; 257/532; 257/530

(58) Field of Classification Search ..... 361/311–313, 361/328–330, 303, 301.1; 257/530, 534; 438/239–240, 244; 29/25.41, 25.42
See application file for complete search history.

(56) References Cited

U.S. PATENT DOCUMENTS

| | | | | |
|---|---|---|---|---|
| 3,766,308 A | | 10/1973 | Loro | |
| 4,152,714 A | * | 5/1979 | Hendrickson et al. | 257/341 |
| 4,190,854 A | * | 2/1980 | Redfern | |
| 5,659,182 A | | 8/1997 | Cohen | |
| 6,198,619 B1 | | 3/2001 | Fujioka | |
| 6,417,557 B1 | | 7/2002 | Haruki | |
| 6,858,916 B2 | * | 2/2005 | Sakoh | 257/530 |
| 2004/0151024 A1 | * | 8/2004 | Fricke et al. | 365/177 |

FOREIGN PATENT DOCUMENTS

| | | | |
|---|---|---|---|
| DE | 31 24740 A1 | * | 4/1982 |
| DE | 196 52 325 C1 | * | 5/1998 |
| EP | 1 111 694 | | 6/2001 |
| EP | 1 111 694 A1 | * | 6/2001 |
| JP | 60121757 | * | 6/1985 |
| JP | 62 155536 | | 7/1987 |
| JP | 09 007887 A | | 1/1997 |
| JP | 10303061 | * | 11/1998 |
| JP | 2000323664 A1 | * | 11/2000 |
| JP | 2003323664 A1 | * | 11/2000 |
| JP | 2001308280 | * | 11/2001 |
| JP | 2000 323664 | | 11/2004 |
| WO | WO 01/93283 | * | 12/2001 |

OTHER PUBLICATIONS

European search report and opinion for related Application No. EP 05 10 669, mailed Apr. 4, 2007.
Japanese Patent Office communication for related Application No. 2004–518391, mailed Feb. 19, 2007.
International Search Report from PCT patent application No. PCT/DE03/01956.*
Preliminary Examnation Report from PCT patent application No. PCT/DE03/01956.*

* cited by examiner

*Primary Examiner*—Eric Thomas
(74) *Attorney, Agent, or Firm*—Brinks Hofer Gilson & Lione

(57) ABSTRACT

A set of integrated capacitor arrangements is presented, each of which has a circuitry-effective main capacitor and a connectable correction capacitor. Each capacitor arrangement has an electrically conductive antifuse connection and antifuse interruption between the correction capacitor and the main capacitor, which are produced after the main capacitor has been formed. The connection and interruption enable the capacitance of the capacitor arrangement to be corrected.

12 Claims, 4 Drawing Sheets

10
12
14
16
18
20
22
24
26
28
30
32
34
36
38
40
42
52
54
56
58
60
62
La
Lb
Lc
C(0)
Cm(l) ... Cm(1)
Cp(N) ... Cp(1)

SET OF INTEGRATED CAPACITOR ARRANGEMENTS, ESPECIALLY INTEGRATED GRID CAPACITORS

Matter enclosed in heavy brackets [ ] appears in the original patent but forms no part of this reissue specification; matter printed in italics indicates the additions made by reissue.

This application is the national stage application of international application number PCT/DE2003/01956, filed on Jun. 12, 2003, which claims the benefit of priority to German Patent Application DE 10230697.4, filed on Jul. 8, 2002, incorporated herein by reference.

The invention relates to an integrated capacitor arrangement containing at least one circuitry-effective main capacitor.

From an integrated arrangement, individual components cannot be mechanically separated from one another without destroying the components. Layer application methods and layer patterning methods, inter alia, are used as fabrication techniques for integrated arrangements.

A capacitor contains two electrodes opposite one another between which a dielectric is arranged. Examples of integrated capacitors are:

so-called MIM capacitors (Metal Insulator Metal), stacked capacitors, also referred to as sandwich capacitors, or grid capacitors.

A capacitance is circuitry-effective if it is not only parasitic, i.e. actually undesired, but is also necessary for the functioning of the circuit arrangement. By way of example, circuitry-effective capacitors serve as:

blocking or backup capacitor, part of a resonant circuit, charging capacitor, or for storing digital information.

In the fabrication of so-called BEOL capacitances (Back End of Line) or of a far BEOL capacitance in integrated form, considerable variations arise in the capacitance values. The variation results from geometry deviations on account of process inhomogeneities. The variations occur within a semiconductor wafer, within a production batch and also between different production batches. If the capacitance value of a capacitor lies outside the predetermined specification limits, then the result is a so-called loss of performance or even a loss of yield of the corresponding integrated circuit.

It is an object of the invention to specify a simple-to-fabricate set of capacitor arrangements whose capacitance is as near as possible to a predetermined desired capacitance. In particular, the intention is to specify a set of grid capacitors.

The set according to the invention contains at least two integrated capacitor arrangements, which have been produced in accordance with identical geometrical designs or layouts and which each contain a circuitry-effective main capacitor and at least one correction capacitor. One capacitor arrangement contains an electrically conductive connection between the correction capacitor and the main capacitor, the connection having been produced after the production of the main capacitor of this capacitor arrangement. The other capacitor arrangement contains an electrically insulating interruption between the same correction capacitor and the main capacitor, the interruption having been produced in accordance with the geometrical designs.

If corrections have to be carried out, for example, only in the case of 20% of the capacitor arrangements fabricated, in order to achieve the desired capacitance, then the outlay decreases considerably compared with a correction possibility in which the correction can be performed only by disconnection of capacitors. This is because, in the case of such a correction, capacitors would need to be locally disconnected in 80% of the capacitor arrangements.

In one development, the connection is produced in a simple manner by local heating, so that components in proximity to the connection are protected from an increased thermal loading. Moreover, permanent links can be produced by local heating in a simple manner. Compared with the production of interruption by local heating, links can be implemented by local heating at lower temperatures. The thermal loading is thus low, particularly during the production of a multiplicity of links on a semiconductor wafer.

The local heating is carried out for example with the aid of a laser beam. This affords a possibility of increasing or decreasing the capacitance of the circuitry-effective main capacitor through connection in parallel or in series with the correction capacitors. This correction possibility allows integrated capacitor arrangements with predetermined capacitance values to be produced in a simple manner.

In one development, the connection contains two interconnect sections which are spaced apart from one another and between which only a dielectric is arranged. The materials of the interconnect sections and of the dielectric are chosen such that material warpages of the interconnect which penetrate through the dielectric arise during the heating. By way of example, it is possible here to utilize the otherwise undesirable "spiking" for producing an electrical connection. In an alternative configuration, the dielectric contains doping atoms which change the conductivity of the dielectric during the heating. Activation of the doping atoms is an expression that is also used in this context. However, there are also other possibilities for producing the connection, which is also referred to as an antifuse.

In a next development, the circuit arrangements contain at least one further correction capacitor, which is disconnected from the main capacitor or has been connected to the main capacitor.

The development is based on the consideration that the capacitance values of integrated capacitors that are actually to be constructed identically vary around a desired value both downward and upward. Corrections can be restricted to a minimum if it is both possible to correct the capacitance value toward larger capacitance values and possible to correct it toward smaller capacitance values. The further correction capacitor affords this second correction possibility in comparison with the abovementioned correction capacitor with the capacitors connected in parallel.

In one development, a further interruption for disconnecting the further correction capacitor is produced by local heating. The local heating can be carried out, for example, with the aid of a laser beam or with the aid of a current surge through an interconnect constriction.

In another development, dielectrics of the capacitors are formed by a dielectric between metallization layers in which connection sections of connections to integrated semiconductor components of the integrated capacitor arrangement are situated. It is possible to use a different dielectric in the region of the capacitor than in the remaining region between the metallization layers, e.g. a dielectric having a higher dielectric constant. Examples of such capacitors are stacked capacitors or grid capacitors. In other words, the electrodes of a capacitor lie in more than two metallization layers. In the case of such capacitors, in one configuration, not only electrodes in the topmost metallization layer but also electrodes in lower metallization layers are disconnected in terms of circuitry or added in terms of circuitry during the correction. The linking elements and interruptions for the lower electrodes are situated either in the lower metallization layer, so that it is necessary, for example, to provide cutouts of corresponding depth for a laser beam, or in an upper metallization layer, to which connections from the lower metallization layer lead.

In another development, dielectrics of the capacitors have a thickness which is significantly less than the thickness of the dielectric between metallization layers. Examples of such capacitors are MIM capacitors. In other words, at least one electrode of the capacitor lies outside a metallization layer.

In a next development, the capacitance of a correction capacitor amounts to less than ⅓, less than 1/10, less than 1/100 or less than 1/1000 of the capacitance of a main capacitor. This measure means that fine trimming is possible. Thus, with possibilities for correction in the thousandths range, the capacitance values of two capacitor arrangements of the same integrated circuit arrangement can be coordinated with one another very precisely. This is absolutely necessary for some applications.

The invention additionally relates to a set of grid capacitors with correction transverse electrodes. Individual transverse electrodes of the grid capacitors also afford a possibility for correction of the capacitance during the production. The abovementioned technical effects therefore apply particularly to the grid capacitors.

Exemplary embodiments of the invention are explained below with reference to the accompanying drawings, in which.

Figure 1:
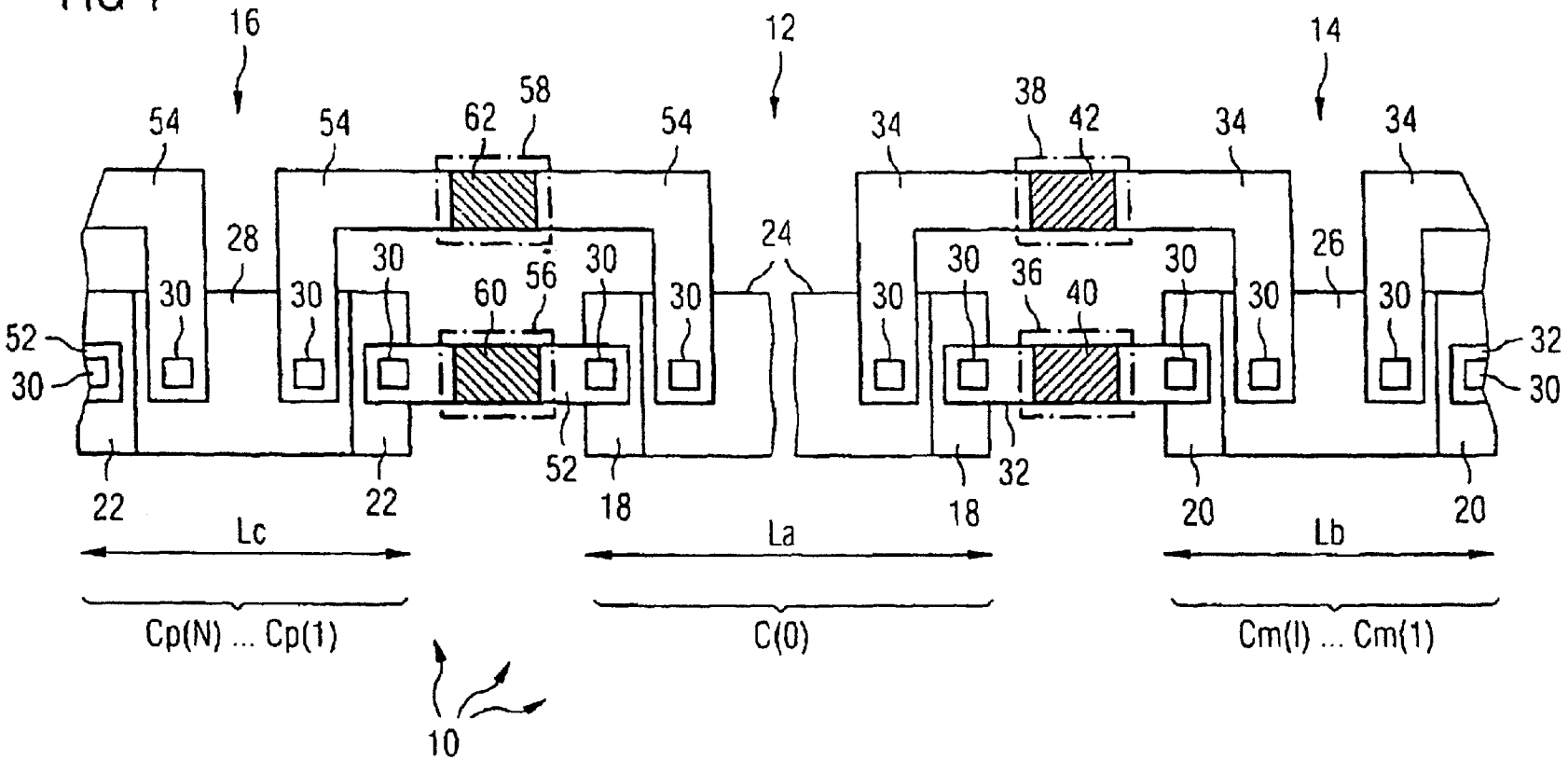
FIG. 1 shows a plan view of an MIM capacitor arrangement.

FIG. 1 shows a plan view of an MIM capacitor arrangement 10, which contains a main capacitor 12 connected to an electronic circuit and a plurality of disconnectable capacitors situated to the right of the main capacitor 12, of which only one disconnectable capacitor 14 is illustrated. The dielectric is not illustrated in FIG. 1 for reasons of improved clarity.

In the capacitor arrangement 10, a plurality of connectable capacitors are situated to the left of the main capacitor 12, of which one connectable capacitor 16 is illustrated in FIG. 1. The capacitors 12 to 16 are constructed identically except for their longitudinal dimensions. The capacitors 12, 14 and 16 respectively contain a bottom electrode 18, 20 and 22 near the substrate and an electrode 24, 26 and 28 remote from the substrate. The bottom electrodes 18, 20 and 22 are longer than the respectively associated electrode 24, 26 and 28 remote from the substrate and project beyond the electrode 24, 26 and 28 remote from the substrate in the longitudinal direction on both sides, so that terminal regions for vertically running contacts 30 are produced at the bottom electrodes 18, 20 and 22 near the substrate.

The main capacitor 12 and the disconnectable capacitors 14 are electrically connected in parallel by interconnects 32 between the bottom electrodes 18, 20 and by interconnects 34 between the electrodes 24, 26 remove from the substrate. As seen geometrically, however, the disconnectable capacitors 14 are arranged in a row one behind the other. The interconnects 32 and 34 are situated in an upper metallization layer. A cutout 36 and 38 in an insulating material (not illustrated) which covers the interconnects 32 and 34 respectively leads to each interconnect 32 and 34. Through the cutouts 36 and 38, during a correction of the capacitance of the main capacitor 12, regions 40 and 42 of an interconnect 32 and 34, respectively, can be vaporized with the aid of a laser beam, thereby producing an interruption.

On the other hand, the connectable capacitors 16 can be electrically connected in parallel with the main capacitor 12 with the aid of interconnects 52 between the bottom electrodes 18, 22 and interconnects 54 between the electrodes 24, 28 remote from the substrate. Geometrically, however, the connectable capacitors 16 are arranged in a row. The interconnects 52 and 54 are also situated in an upper metallization layer.

Cutouts 56 and 58 lead through an insulating material (not illustrated) as far as linking regions 60 and 62 of the interconnects 52 and 54, respectively. The linking regions 60, 62 form so-called antifuses, i.e. a connection possibility which forms a permanent electrically conductive connection between the sections of the interconnect 52 and an interconnect 54, respectively, upon the impingement of a laser beam.

The main capacitor 12 has a length La in the longitudinal direction of the capacitor arrangement 10, said length being greater than lengths Lb of the disconnectable capacitors 14 and lengths Lc of the connectable capacitors 16. As a result, a capacitance C(0) of the main capacitor 12 is also greater than a capacitance Cm(I) of the capacitor 14. In this case 1 is a natural number for designating the last disconnectable capacitor 14. The disconnectable capacitors not illustrated have capacitances Cm(1) to Cm(I–1) which are equal to the capacitance Cm(I) in the exemplary embodiment explained.

The capacitance C(0) of the main capacitor 12 is likewise greater than the capacitance Cp(1) of the connectable capacitor 16. The connectable capacitors not illustrated in FIG. 1 have capacitances Cp(2) to Cp(N), which are equal to the capacitance Cp(1) or Cm(I). In this case, N is a natural number for designating the last connectable capacitor.

The correction of the capacitance of the electrode arrangement 10 is explained in more detail below with reference to FIG. 5.

In another exemplary embodiment, there is only one disconnectable capacitor 14 and one connectable capacitor 16 to the right and left, respectively, of the main capacitor 12. In a next exemplary embodiment there is only one or a plurality of connectable capacitors 16 and, respectively, only one or a plurality of disconnectable capacitors 14 beside the main capacitor 12. In a next exemplary embodiment the capacitances Cm(1) to Cm(I) of the capacitor arrangement 10 are different from one another. The capacitances Cp(1) to Cp(N) of the capacitor arrangement 10 can also be made different from one another.

Figure 2:
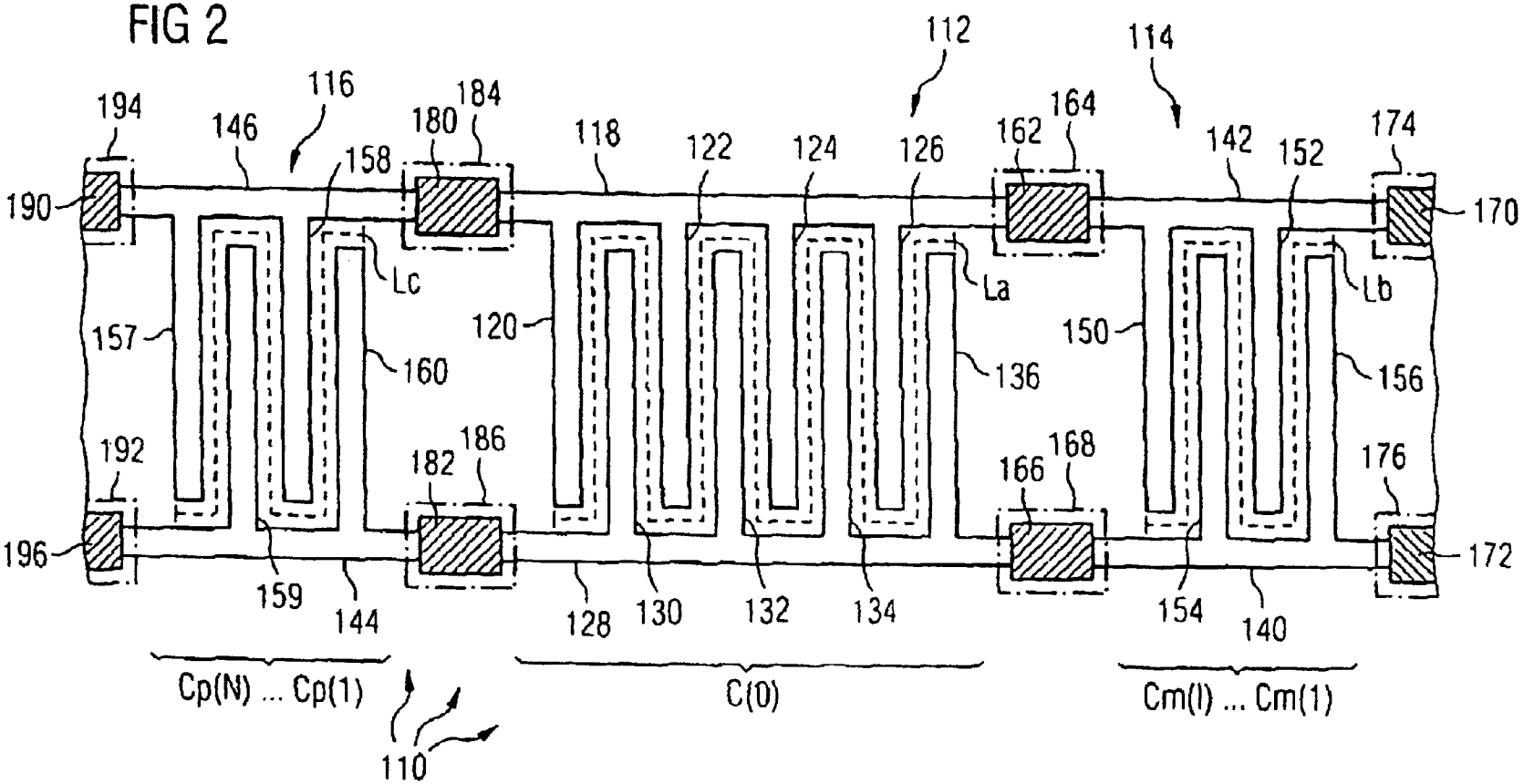
FIG. 2 shows a plan view of a grid capacitor arrangement.

FIG. 2 shows a plan view of a grid capacitor arrangement 110, which contains a main capacitor 112 connected to a circuit and a plurality of disconnectable capacitors, one capacitor 114 of which is illustrated in FIG. 2. Furthermore, the grid capacitor arrangement 110 contains a plurality of connectable capacitors, one capacitor 116 of which is illustrated in FIG. 2. Only the upper electrode of the main capacitor 112 and of the capacitor 114 and of the capacitor 116 is respectively illustrated in FIG. 2. In the underlying metallization layers there are further electrodes having the same profile as the upper electrodes. In a first exemplary embodiment, the electrodes of a capacitor 112, 114 and 116 which are situated in the different metallization layers are connected among one another in each case by at least one vertical content. Interconnects between capacitors 112, 114 and 116 are situated only in the upper metallization layer.

In the upper metallization layer, the main capacitor 112 contains two comb-shaped electrodes whose tines mesh with one another. By way of example, four transverse electrodes 120 to 126 lined up in a uniform grid dimension branch off from a longitudinal electrode 118. On a longitudinal electrode 128 opposite the longitudinal electrode 118, there are arranged, transversely with respect to the longitudinal electrode 128, exactly as many transverse electrodes 130 to 136 as on the longitudinal electrode 118, i.e. four transverse electrodes 130 to 136 which extend into the interspaces between the transverse electrodes 120 to 126. A meandering interspace is thus formed between the transverse electrodes 120 to 126 and 130 to 136, said interspace being filled by a dielectric. The length of the meander of the main capacitor 112 shall again be La.

The disconnectable capacitors and the connectable capacitors are constructed like the main capacitor 112, but contain shorter longitudinal electrodes 140, 142, 144 and 146, respectively from each of which, by way of example, only two transverse electrodes 150 to 160 branch.

Situated between the longitudinal electrode 118 and the longitudinal electrode 142 of the capacitor 114 is a region 162, to which a cutout 164 leads from the surface of the integrated circuit. Situated between the longitudinal electrode 128 and the longitudinal electrode 140 of the capacitor 114 is a region 166, to which a further cutout 168 leads. Through the cutouts 164 and 168, it is possible, with the aid of a laser beam, to produce an interruption between the longitudinal electrodes 118 and 142 and the longitudinal electrodes 128 and 140 in the region 162 and 166, respectively. As a result, all the disconnectable capacitors 114 can be disconnected from the main capacitor 112. Situated between the further disconnectable capacitors are further regions 170 and 172, to which cutouts 174 and 176 lead, so that disconnection can also be effected at other locations.

A linking region 180 is situated between the longitudinal electrode 118 and the longitudinal electrode 146 of the correction capacitor 116. A linking region 182 is situated between the longitudinal electrode 128 and the longitudinal electrode 144 of the capacitor 116. A cutout 184 and 186 leads to the linking region 140 and to the linking region 182, respectively. Through the cutouts 184 and 186, the linking regions 180 and 182 can be locally heated with the aid of a laser beam. During the local heating, a connection is produced between the longitudinal electrode 118 and the longitudinal electrode 146, and between the longitudinal electrode 128 and the longitudinal electrode 144. Electrically conductive connections to further connectable capacitors 116 can be produced with the aid of further linking regions 190, 192 to which cutouts 194 and 196, respectively, lead.

The meander of the main capacitor 112 has a length La, which is greater than a length Lb of a meander of the disconnectable capacitor 114 and a length Lc of a meander of the connectable capacitor 116. As a result, a capacitance (C0) of the main capacitor 112 is greater than a capacitance Cm(I) of the disconnectable capacitor 114. Further capacitances Cm(1) to Cm(I−1) of further disconnectable capacitors are equal to the capacitance Cm(I). A capacitance Cp(1) of the connectable capacitor 116 is equal to the capacitance Cm(1). Capacitances Cp(2) to Cp(N) of the further disconnectable capacitors 116 are equal to the capacitance Cp(1).

The correction of the capacitance of the circuit arrangement 110 is explained in more detail below with reference to FIG. 5.

In another exemplary embodiment, there are cutouts which lead into different metallization layers, for example to connection or interruption possibilities which are arranged offset with respect to connection or interruption possibilities situated above or below the latter. In an alternative exemplary embodiment, linking regions or regions for interruptions are arranged in an upper metallization layer even though they also relate to electrodes in lower metallization layers. Furthermore, the capacitances Cm(1) to Cm(I) or Cp(1) to Cp(N) of the capacitor arrangement 110 may have capacitances that differ from one another.

Figure 3:
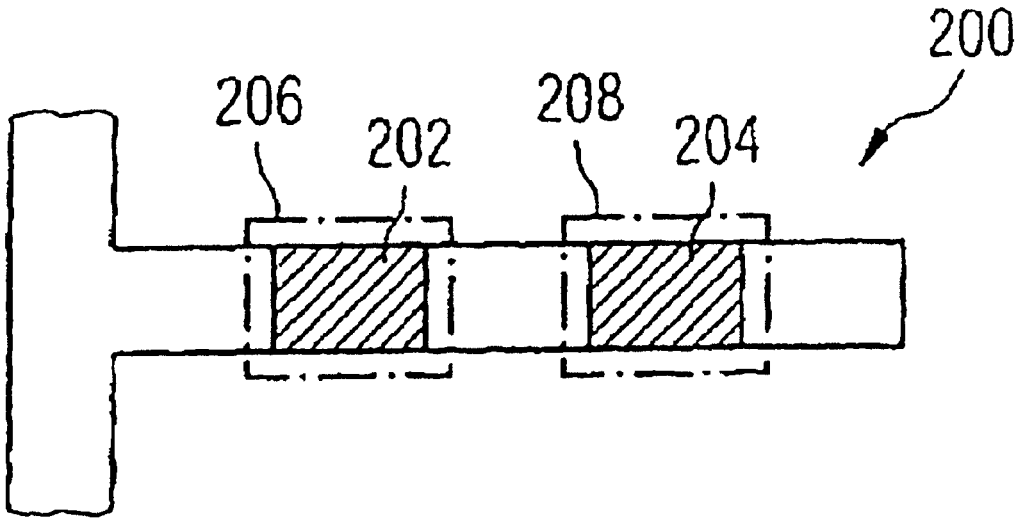
FIG. 3 shows a transverse electrode of a grid capacitor with two interruption possibilities.

FIG. 3 shows a transverse electrode 200 of a grid capacitor. The transverse electrode 200 has a region 202 over approximately one third of its length and a region 204 over approximately two thirds of its length. A cutout 206 leads to the region 202. A cutout 208 leads to the region 204. During the correction of the capacitance of the grid capacitor to which the transverse electrode 200 belongs, either an interruption is produced in the region 202 or an interruption is produced in the region 204. If the interruption is produced in the region 202, then only approximately one third of the transverse electrode 200 is circuitry-effective. By contrast, if an interruption is produced in the region 204, then approximately two thirds of the transverse electrode 200 are circuitry-effective. Through the selection of a region 202 or 204, it is possible to implement corrections of the capacitance of the grid capacitor in the thousandths range.

The length of the transverse electrode 200 is 10 micrometers, for example. The width is 0.5 micrometer, for example, so that a process of severing using a laser beam is possible without any difficulty.

Figure 4:
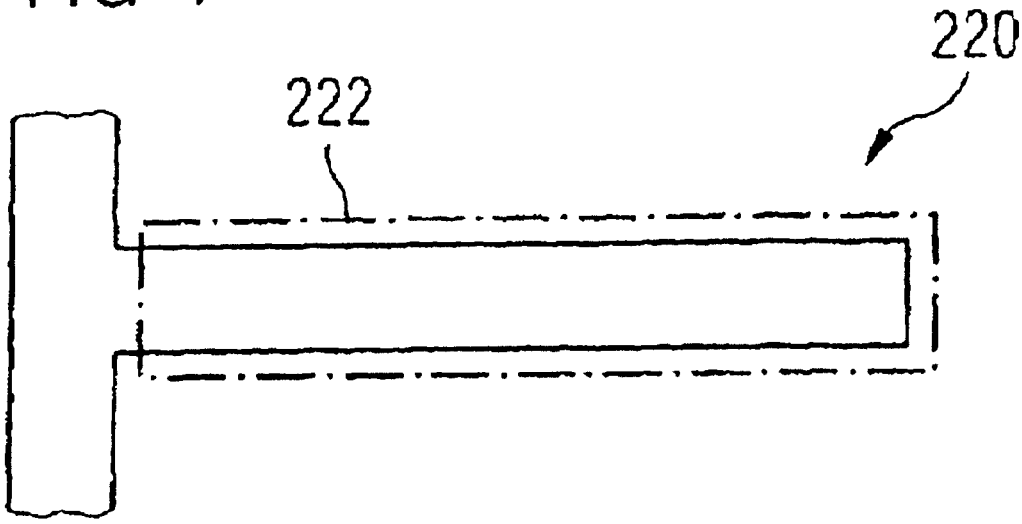
FIG. 4 shows a transverse electrode of a grid capacitor with a continuous interruption possibility.

FIG. 4 shows a transverse electrode 220, to which a cutout 222 leads. The cutout 222 extends approximately over the entire length of the transverse electrode 220. As a result, it is possible to interrupt the transverse electrode 220 at any desired location. In other words, the interruption points can be placed continuously along the longitudinal axis of the transverse electrode 220.

In other exemplary embodiments of transverse electrodes 200 and 220, linking regions are used instead of, or in combination with, the regions serving for interruption. The interruption regions and/or the linking regions are arranged either on one transverse electrode of a grid capacitor or on a plurality of transverse electrodes of the grid capacitor.

Figure 5:
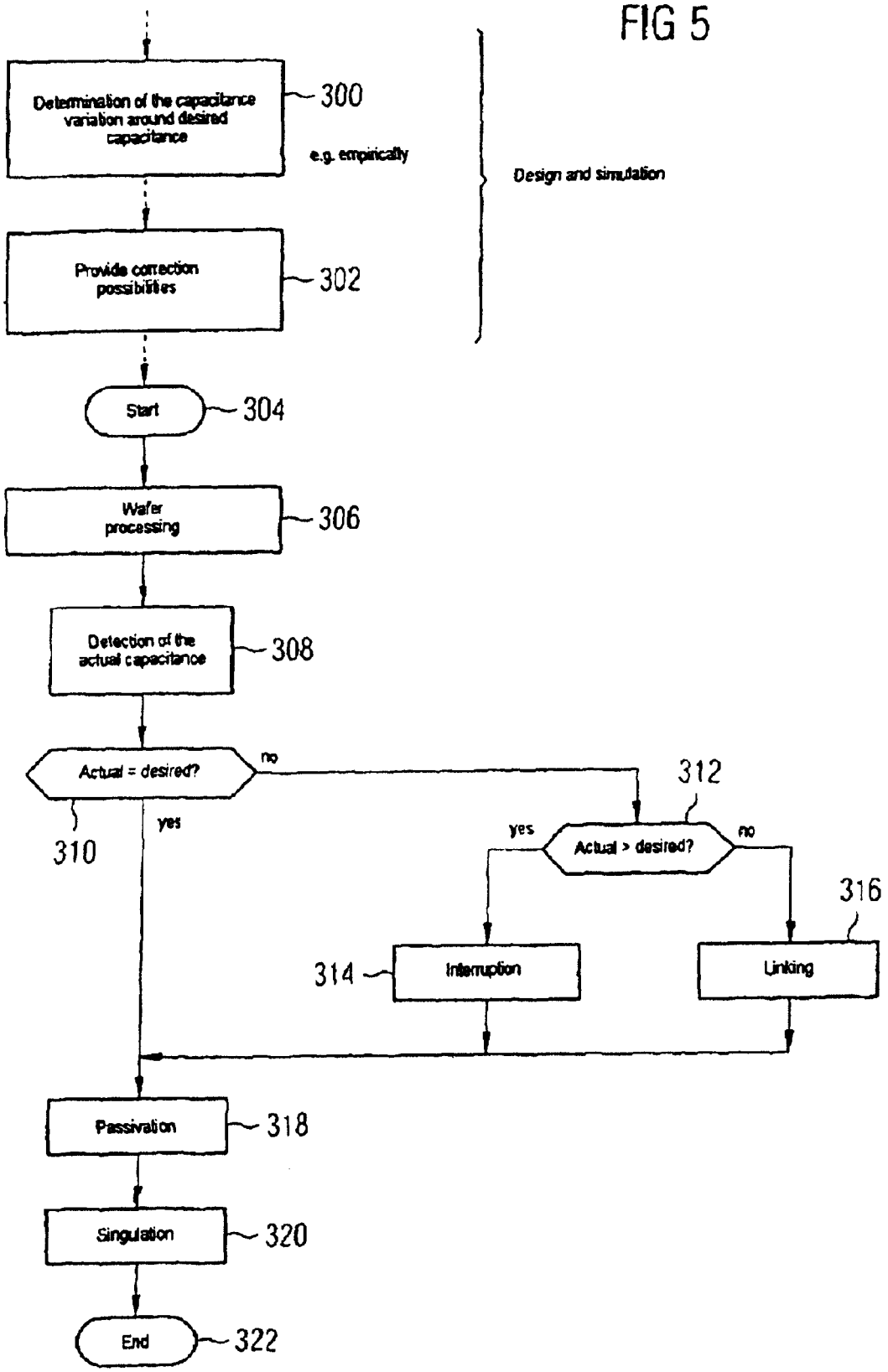
FIG. 5 shows method steps for correcting the capacitance of an integrated capacitor.

FIG. 5 shows method steps for correcting the capacitance of an integrated capacitor arrangement, e.g. according to FIG. 1, 2, 3 or 4. In the front end of the method, in a design and simulation stage, the variation of the capacitance of the integrated circuit arrangement around a desired capacitance is determined, for example empirically or on the basis of simulation runs, see method step 300. Correction possibilities are provided depending on the capacitance variations, see method step 302. The correction possibilities are, for example, disconnectable capacitors, connectable capacitors, disconnectable capacitor regions and/or connectable capacitor regions. The correction possibilities are prescribed in method step 302 taking account of the expected capacitance variation such that, with regard to the overall production, the fewest possible interruptions and links have to be produced by heating using the laser beam.

The actual correction method begins in a method step 304, which is followed by the processing of a wafer, see method step 306. By way of example, transistors are produced in a semiconductor material of the wafer. Afterward, metallization layers are applied, capacitors also being produced.

In a method step 308, a measurement is used to detect the actual capacitance of an integrated capacitor arrangement, i.e. in particular the capacitance of the main capacitor 12, 112 together with the capacitances of the disconnectable capacitors 14, 114.

In a subsequent method step 310, the actual capacitance is compared with the desired capacitance. If the actual capacitance is less than or greater than the desired capacitance, in particular less than or greater than a predetermined tolerance range, then method step 310 is directly followed by a method step 312. In method step 312, a check is made to determine whether the actual capacitance is greater than the desired capacitance. If this is the case, then method step 312 is followed by a method step 314, in which interruptions are produced in the integrated capacitor arrangement with the aid of a laser beam, disconnectable capacitors 14, 114 being disconnected from the main capacitor 12, 112. The capacitance of the capacitor arrangement decreases. A disconnection of an electrode section from a transverse electrode is also carried out as an alternative.

By contrast, if it is ascertained in method step 312 that the actual capacitance is less than the desired capacitance, then method step 312 is directly followed by a method step 316. In method step 316, linking regions are heated with the aid of a laser beam. As a result, connectable capacitors 16, 116 are supplementarily connected to the main capacitor 12, 112 or to a main region. The capacitance of the capacitor arrangement thus increases in the direction of the desired capacitance. A connection of electrode sections of a transverse electrode is also carried out as an alternative.

By contrast, if it is ascertained in method step 310 that actual capacitance and desired capacitance match, then a method step 318 follows directly afterward. Method step 318 is also executed after method step 314 or method step 316. The wafer is processed further in method step 318. In this case, inter alia, a passivation layer is applied, which closes off the cutouts for the laser beam.

In a further method step 320, the circuits arranged on the wafer are singulated and encapsulated in housings. The method is ended in a method step 322.

In another exemplary embodiment, the correction is carried out after the singulation of the circuits. By way of example, current surges are used to heat the interruption regions or the linking regions. The interrogations in method steps 310 and 312 can also be formulated differently.

The method specified affords the following advantages:

the variations in the capacitances caused by geometry or process fluctuations can subsequently be corrected in a simple manner. The yield or the performance can thus be increased.

The possibility of subsequent correction furthermore allows individual capacitance matching for the respective integrated circuit. Capacitance matching specifically coordinate with other circuit elements can thus be performed, e.g. for the purpose of optimum setting of an operating point. This is advantageous, particularly when the other circuit elements can no longer be corrected.

By disconnecting or adding regions of the capacitor with the aid of so-called fuses or antifuses, it is thus possible to subsequently correct the influence of process and geometry fluctuations on the parameters of the main capacitor, in particular on the capacitance and on the resistance (and thus on the RC constant).

During the correction in method steps 310 to 316, it is possible to use the following formula:

$$Ccorr=C(0)-sum(i=1 \text{ to } I1 \text{ over } Cm(i))+sum(n=1 \text{ to } N1 \text{ over } Cp(n)),$$

where the quantities used have already been explained above, except for the quantities I1 and N1. The index i in the summation over the capacitances Cm must take account of all the disconnected capacitors, where I1 designates the last disconnected capacitor. The index in the summation over the capacitances Cp must take account of all the connected capacitances, where N1 designates the last connected capacitor. Furthermore, it must be taken into consideration that either capacitors are connected or disconnected.

If the capacitances Cm and Cp are identical, then it is possible, instead of the sum, to effect multiplication by a factor specifying the number of disconnected capacitors or connected capacitors.

In the determination of the capacitance variation, it is possible to use the following relationships applicable to a plate capacitor.

$$C=\epsilon 0\cdot\epsilon r\cdot Aeff/Deff.$$

where $\epsilon 0$, $\epsilon r$ represent the corresponding dielectric constants, Aeff represents the effective electrode area and Deff represents the effective distance between electrodes. A fluctuation in the area ΔAeff or in the distance ΔDeff then causes a change in the capacitance of:

$$\Delta c=\Delta Aeff/Aeff \text{ or } \Delta c=\Delta Deff/Deff$$

To a first approximation, the effective electrode area corresponds, in the case of:

a) the MIM capacitors: to the overlapping area of the electrodes, b) the sandwich capacitors: to the area of the metal electrodes, c) the grid capacitors: to the side area of the interconnects, which results from the length L and the thickness T.

The effective distance between electrodes corresponds, in the case of:

a) the MIM capacitors: to the thickness of the dielectric, which differs from the dielectric between the metallization layers, b) the sandwich capacitors: to the thickness of the intermetal dielectric, c) the grid capacitors: to the thickness of the intrametal dielectric, i.e. the so-called spacing.

In grid capacitors, for example, another influencing factor is the formation of corners. These influencing quantities can at least be detected by measurement and then be taken into account.

The fluctuations in the capacitances may have the following process-dictated causes:

a) MIM capacitors: fluctuations in the thickness of the MIM dielectric, e.g. due to inhomogeneous deposition rates over the wafer, or different roughness of the lower electrode.

b) Sandwich capacitors: fluctuations in the thickness of the intermetal dielectric, e.g. thickness fluctuations due to polishing inhomogeneities or fluctuations in the etching depth over the wafer.

c) Grid capacitors: fluctuations in the distance between electrodes due to variation of the thickness of the intrametal dielectric caused e.g. by lithography fluctuations, RIE patterning (Reactive Ion Etching) with the use of aluminum or by trench etching with the use of copper. Further causes are fluctuations in the electrode area due to variation of the interconnect thickness or due to CMP fluctuations (Chemical Mechanical Polishing), so-called dishing, non-right-angled trench profile with the use of copper or due to inhomogeneous deposition rates.

In MIM capacitors and sandwich capacitors, the capacitance is corrected by direct disconnection or connection of M area segments of the electrode:

$$A=A0\pm\text{sum}(i=1 \text{ to } M \text{ over } Ai),$$

where A0 is the electrode basic area that can no longer be corrected, M is a natural number and Ai is the disconnectable or connectable discrete area elements. The minus sign applies to the disconnectable area elements. The plus sign applies to the connectable area elements.

In the grid capacitors, the electrode area A is set by way of the length L of the interconnect: A=L·T, where T is the mean interconnect thickness within the capacitor structure. Through disconnection or connection of M interconnect segments, e.g. n discrete segments Li of the electrode, correction is effected as follows:

$$L=L0\pm\text{sum}(i=1 \text{ to } M \text{ over } Li)$$

where L0 denotes the electrode basic length that can no longer be corrected, M denotes a natural number and Li denotes the disconnectable or connectable discrete interconnect segments. The minus sign applies to the disconnectable interconnect segments. The plus sign applies to the connectable interconnect segments.

LIST OF REFERENCE SYMBOLS

10 MIM capacitor arrangement
12 Main capacitor
14 Disconnectable capacitor
16 Connectable capacitor
18, 20, 22 Bottom electrode near the substrate
24, 26, 28 Electrode remote from the substrate
30 Contact
32, 34 Interconnect
36, 38 Cutout
40, 42 Region
52, 54 Interconnect
56, 58 Cutout
60, 62 Linking region
La to Lc Length
C(0), Cm(1), Cp(1) Capacitance
110 Grid capacitor arrangement
112 Main capacitor
114 Disconnectable capacitor
116 Connectable capacitor
118 Longitudinal electrode
120 to 126 Transverse electrode
128 Longitudinal electrode
130 to 136 Transverse electrode
140 to 146 Longitudinal electrode
150 to 160 Transverse electrode
162 Region
164 Cutout
166 Region
168 Cutout
170, 172 Region
174, 176 Cutout
180, 182 Linking region
184, 186 Cutout
190, 192 Linking region
194, 196 Cutout
200 Transverse electrode
202, 204 Region
206, 208 Cutout
220 Transverse electrode
222 Cutout
300 Determination of the capacitance variation
302 Provide correction possibility
304 Start
306 Wafer processing
308 Detection of the actual capacitance
310 Actual equal to desired?
312 Actual>desired?
314 Interruption
316 Linking
318 Passivation
320 Singulation
322 End

The invention claimed is:

1. A set of integrated capacitor arrangements, *comprising,*

[having] at least [two] *a first and second* integrated capacitor [arrangements] *arrangement*, which have been produced in accordance with identical geometrical designs and which each contain a circuitry-effective main capacitor and at least one correction capacitor,

[having] an electrically conductive antifuse connection between the correction capacitor and the main capacitor in [a] *the* first [of the] capacitor [arrangements] *arrangement*, the connection having been produced after the production of the main capacitor of the first capacitor arrangement,

[having] an electrically insulating antifuse interruption between the correction capacitor of the [first] *second* capacitor arrangement and the main capacitor in [a] *the* second [of the] capacitor [arrangements] *arrangement*, the interruption having been produced in accordance with the geometrical designs,

[having] at least one further correction capacitor in each capacitor arrangement,

[having] a further electrically conductive fuse connection between the further correction capacitor and the main capacitor in the first capacitor arrangement, the further connection having been produced in accordance with the geometrical designs, and

[having] a further electrically insulating fuse interruption between the further correction capacitor in the [first] *second* capacitor arrangement and the main capacitor in the second capacitor arrangement, the interruption having been produced after production of the main capacitor of the second capacitor arrangement.

2. The capacitor arrangements as claimed in claim 1, wherein the connection and the interruption are situated at identical positions in the capacitor arrangements.

3. The capacitor arrangements as claimed in claim 1, wherein at least one of: the connection has been produced by local heating and the connection contains a material warpage which penetrates through a dielectric.

4. The capacitor arrangements as claimed in claim 1, wherein at least one of: a material covering the connection contains a cutout leading to the connection, a material covering the interruption contains a cutout leading to the interruption, and the cutouts are filled with a passivating material.

5. The capacitor arrangements as claimed in claim 1, wherein the further interruption arose as a result of local heating and vaporization of an electrically conducting section.

6. The capacitor arrangements as claimed in claim 1, wherein dielectrics of the capacitors have a thickness which is equal to a thickness of a dielectric between metallization layers in which connection sections of connections to integrated semiconductor components are situated.

7. The capacitor arrangements as claimed in claim 1, wherein at least one of: the capacitors have electrodes situated in more than two metallization layers, and the electrodes are formed in a whole-area or grid-like manner.

8. The capacitor arrangements as claimed in claim 1, wherein dielectrics of the capacitors have a thickness which is less than a thickness of a dielectric between metallization layers in which connection sections of connections to integrated semiconductor components are situated.

9. The capacitor arrangements as claimed in claim 1, wherein a capacitance of one of the correction capacitors amounts to less than ⅓ of a capacitance of the main capacitor to which the correction capacitor is connected.

10. A method for producing a set of integrated grid capacitors, the method comprising:

forming at least two integrated grid capacitors in accordance with identical geometrical designs, each grid capacitor containing a plurality of transverse electrodes forming a circuitry-effective main part of the grid capacitor, forming at least two correction transverse electrodes arranged at identical positions in the grid capacitors to have circuitry-effective lengths of different magnitudes after the production of the main part, the circuitry-effective length of each correction transverse electrode that has been changed having been lengthened by production of an electrically conductive connection or having been shortened by at least one of an electrically insulating interruption and by vaporization of part of the correction transverse electrode, and, in a material covering the shortened correction transverse electrode, forming at least one cutout leading at least one of: to the shortened correction transverse electrode and to a region at which the shortened correction transverse electrode was arranged prior to the vaporization.

11. The method as claimed in claim 10, wherein the cutout is filled with a passivating material.

12. The method as claimed in claim 11, wherein a plurality of cutouts lead to a correction transverse electrode, or wherein one cutout which essentially covers the entire region of the original correction transverse electrode leads to a correction transverse electrode.

* * * * *